United States Patent [19]

Melse et al.

[11] 3,821,847

[45] July 2, 1974

[54] METHOD OF PROVIDING A PATTERN OF CONDUCTORS ON AN INSULATING FLEXIBLE FOIL OF A SYNTHETIC MATERIAL

[75] Inventors: Jan Leendert Melse; Martinus Adriaan Groenewegen, both of Emmasingel, Eindhoven, Netherlands

[73] Assignee: U.S. Phillips Corporation, New York, N.Y.

[22] Filed: Jan. 26, 1972

[21] Appl. No.: 220,981

[30] Foreign Application Priority Data

Feb. 5, 1971 Netherlands ....................... 7101602

[52] U.S. Cl. ..................... 29/624, 29/193.5, 29/626, 96/35.1, 96/36.2, 204/15, 204/199, 204/200

[51] Int. Cl. ............................................. C23b 5/68

[58] Field of Search .......... 29/193.5, 624, 625, 626; 204/15, 38 R, 198, 199, 200, 212, 215; 117/212; 96/35.1, 36.2, 36.3, 38.4

[56] References Cited

UNITED STATES PATENTS

| | | | |
|---|---|---|---|
| 2,438,205 | 3/1948 | Coates | 204/15 X |
| 2,854,386 | 9/1958 | Lyman et al. | 204/15 |
| 3,099,608 | 7/1963 | Radovsky et al. | 204/15 |
| 3,481,840 | 12/1969 | Lupinski et al. | 204/38 R X |
| 3,548,494 | 12/1970 | Haring | 117/212 X |
| 3,668,003 | 6/1972 | Furness | 117/212 |

*Primary Examiner*—Charles W. Lanham
*Assistant Examiner*—Joseph A. Walkowski
*Attorney, Agent, or Firm*—Frank R. Trifari

[57] ABSTRACT

Patterns of conductors which are destined as current supply members of a semiconductor body, for example, an integrated circuit, are provided on an insulating flexible foil of a synthetic material resin. Each pattern of conductors consists of two groups of conductors. In order to be able to provide the conductors in series production by electrodeposition, a large number of rows of conductor tracks is provided on the foil, the outer ends of the conductor tracks of corresponding groups in a row being connected to a continuous metal track. A connection track between the metal tracks is provided between at least a number of successive patterns of conductors in a row. The tracks are then covered by means of an electrodeposition process by at least one metal layer of the desirable thickness.

5 Claims, 1 Drawing Figure

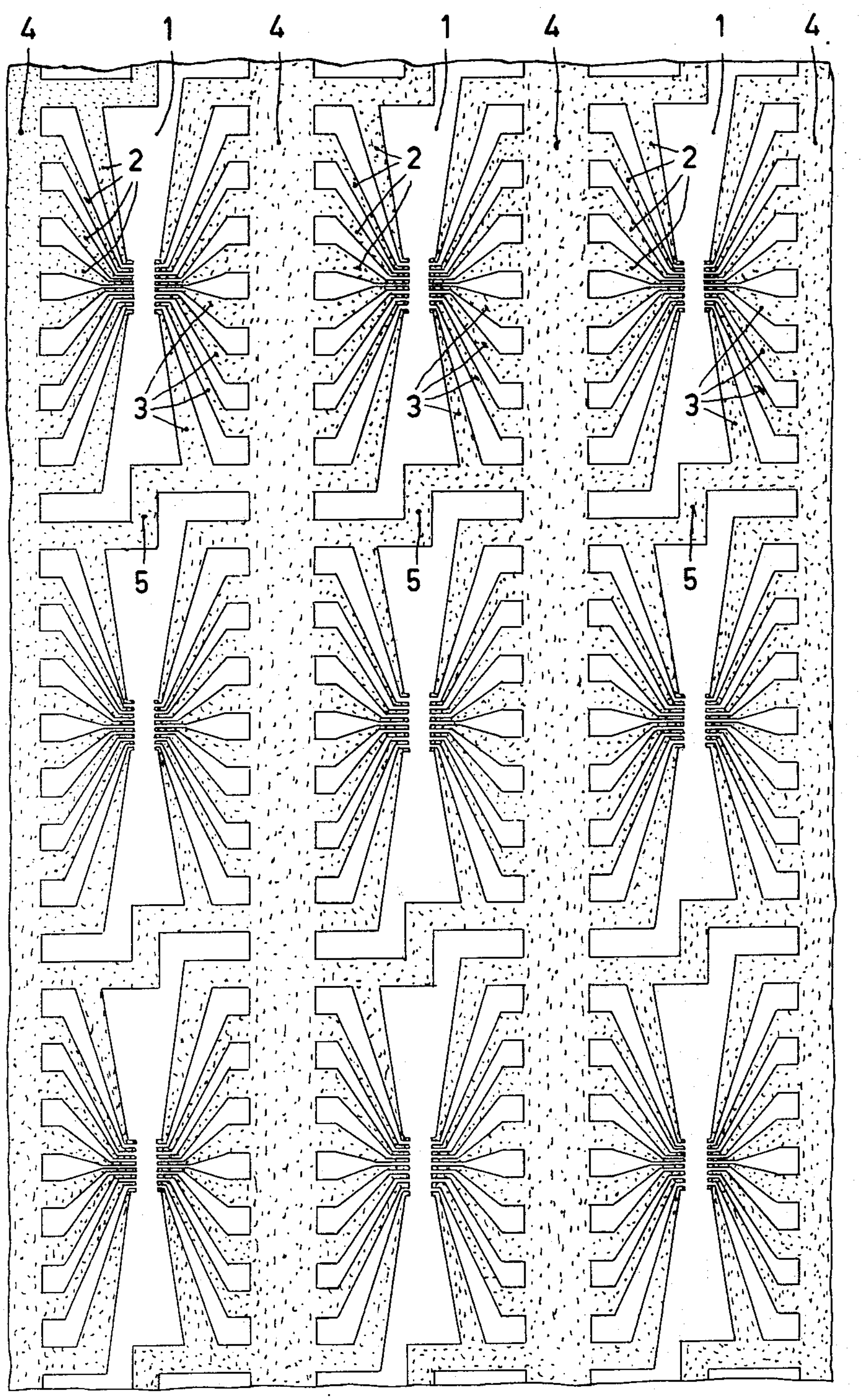
4
1
4
1
4
1
4
2
2
2
3
3
3
5
5
5

METHOD OF PROVIDING A PATTERN OF CONDUCTORS ON AN INSULATING FLEXIBLE FOIL OF A SYNTHETIC MATERIAL

The invention relates to a method of providing a pattern of conductors on an insulating flexible foil of a synthetic material, which pattern of conductors consists of two groups of conductors in which contact places of a semiconductor body can be connected to ends of the two groups of conductors facing each other.

In such a method it is known to cover the foil with a layer of metal by vapour deposition and to obtain the conductors in that the whole metal layer, the conductors excepted, is removed by etching by means of a photo-etching method. This method of manufacturing is comparatively expensive and time-consuming.

It is the object of the invention to provide a cheaper and faster method in which the accuracy of the very finely formed pattern of conductors can be readily controlled and the thickness of the conductors can be obtained at will. In order to achieve the end in view, according to the invention, a number of rows of conductor tracks are provided on the foil, the outer ends of the conductor tracks of corresponding groups in a row being connected to a continuous metal track, a connection track between the metal tracks being provided at least between a number of successive patterns of conductors in a row, said tracks being reinforced by at least one metal layer by electrodeposition.

As a result of the electrodeposition, the conductors can be obtained in a faster and cheaper manner in a continuous process. A particularly fine and accurate pattern of conductor tracks can now be obtained by using a photo-sensitive compound which after exposure is capable of supplying metal nuclei from a solution of metal salts, which nuclei image can than be intensified. During the electrodeposition process, however, all the conductors of a pattern must be at the same electric potential to obtain an absolutely equal thickness of the conductors. In order to solve this problem in a manner which is favourable for series production, the metal tracks and the connection tracks are provided. By means of these measures it is made possible to perform the electrodeposition process in such manner that a great uniformity of the thickness of the layers is obtained.

In a favourable embodiment, a connection track is provided between each of the successive patterns of conductor tracks. In this case, the connection tracks are preferably constituted by two parts which extend mainly at right angles to the metal tracks and which are shifted mutually in the longitudinal direction of the metal tracks, said two parts being connected by a portion extending in the direction of the metal tracks. This embodiment has the advantage that the connection tracks may also serve as an alignment mark in later processes, such as the connection of the semiconductor body, the electric measurement, and the like.

In a further embodiment, at least one conductor track of each conductor pattern is connected to a connection track. The conductor in question will in general form the earth contact for the semiconductor device in which another component of the semiconductor envelope to be connected to earth can be contacted to the connection track.

In order to obtain a single support for a semiconductor body, a part which comprises a pattern of conductors without the metal tracks is cut out of the foil.

In order that the invention may be readily carried into effect, one embodiment thereof will now be described in greater detail, by way of example, with reference to the accompanying diagrammatic drawing the sole FIGURE of which shows a foil of a flexible electrically insulating synthetic resin.

The foil 1 consists preferably of a polyimide and has a thickness of, for example, 25 microns. A number of rows of patterns of conductors 2, 3 are provided on the foil 1. The conductors of a pattern consist of two groups, the conductors 2 forming one group, the conductors 3 forming the other group. The conductors are destined for use as current supply members for a semiconductor body not shown, for example an integrated circuit. For that purpose, the contact places on said semiconductor body are connected to the ends of the conductors 2, 3 facing each other. In order to obtain a good connection it is necessary for the thickness of all the conductors 2, 3 in a pattern of conductors to have the same value. In order to obtain a rapid and inexpensive manufacture, growing of the conductors is carried out by means of an electrodeposition process.

The patterns of conductor tracks are preferably provided on the foil 1 by means of a photosensitive compound which, after exposure, is capable of supplying metal nuclei from a solution of metal salts, for example mercurous salts, silver salts, gold salts, platinum salts and palladium salts. Upon providing the nuclei image of conductor tracks, nuclei images of metal tracks 4 are also provided to which the ends of the conductor tracks which constitute the ultimate conductors 2 and 3, respectively, are connected. During the electrodeposition process, the metal tracks are connected to the negative terminal of the voltage source, so that the conductor tracks are hence also at said negative voltage. During the electro-deposition of the conductor tracks, however, the contact resistance between the metal tracks 4 and a guide roller for the foil placed in the electrodeposition bath and also transferring the negative voltage to the metal tracks, may differ mutually. As a result of this, non-uniformity of the thickness of the conductor tracks might occur in which the thickness of the conductors from group 2 would not be the same as the thickness of the conductors from group 3. It may also occur that the electric conductivity in the nuclei images is not the same everywhere as a result of which the thickness of the electrodeposited layer might differ locally, in particular in the case of long and wide foils. In order to check this, an electrically conductive connection track 5 is provided at least in some places between the tracks 4. The voltage of all the conductors from all rows will now be the same so that a uniform conductor thickness will surely be obtained. These connection tracks 5 are preferably provided between the successive patterns. In this case the connection pattern need not be removed when the pattern of conductors is used as a support for a semiconductor body. At the same time, the connection tracks may in this case serve as an alignment mark during the connection of the semiconductor bodies to the conductors, upon cutting loose the metal tracks 4 from the conductors and during the automatic electric measurements. For that purpose, the connection track preferably has the shape as is shown in the FIGURE which consists of two mutually shifted parts extending at right angles to the metal tracks 4 and a connection portion extending in the direction of the metal tracks.

In a favourable embodiment, a 6 microns thick layer of copper was first electro-deposited on the metal nuclei image. A layer of nickel, 2 microns thick, was then vapour-deposited on said copper layer, succeeded by the deposition of a layer of gold, 1 micron thick. In this application, the semiconductor element was soldered to the conductors.

The patterns of tracks may also be provided in a different manner before carrying out the electrodeposition process. For example, a very thin metal layer may be provided on the foil and the pattern of tracks be obtained by means of a photo-chemical etching process. However, the above-mentioned manner of providing the tracks is to be preferred.

For the application as a support for semiconductor bodies, a semiconductor body is connected to each conductor pattern, for example, by soldering the connection places of the semiconductor body to the conductors, after which the metal tracks 4 are cut away. A strip obtained in this manner can be tested electrically and separate parts of the foil with a semiconductor can be cut out of it at any desirable instant. The cutting will preferably be carried out through the central portion of the connection track 5.

What is claimed is:

1. A method for continuously electroplating conductive lead patterns on a continuous sheet of insulating material comprising the steps of:

depositing on said sheet a plurality of spaced conductive longitudinal strips;

depositing on said sheet a plurality of spaced conductive connecting strips electrically connecting adjacent longitudinal strips;

depositing on said sheet between said longitudinal and connecting strips electroplatable conductive lead patterns having spaced lead elements extending to and electrically connecting with a conductive strip;

continuously conveying said sheet longitudinally through an electroplating bath such that a continuously changing portion of said sheet is within said electroplating bath; and continuously applying a constant electrical potential to at least one but not necessarily continuously the same longitudinal strip at a position on said longitudinal strips about to enter said electroplating bath.

2. The method of claim 1 wherein said step of applying an electrical potential comprises the step of continuously conveying said sheet longitudinally past at least one roller held at an electrical potential, said at least one roller electrically contacting at least one longitudinal strip.

3. The method of claim 2 wherein said sheet is continuously conveyed past more than one roller held at the same electrical potential and at least one but not necessarily continuously the same roller makes continuous electrical contact with at least one but not necessarily continuously the same longitudinal strip.

4. The method of claim 1 wherein said longitudinal and connecting strips are deposited by photo defining electroplatable conductive longitudinal and connecting strips.

5. The method of claim 1 wherein said spaced longitudinal strips and said spaced connecting strips are deposited to define a grid having enclosed areas in which individual lead patterns are photo defined.

* * * * *